United States Patent [19]
Hodgson et al.

[11] Patent Number: 4,814,855
[45] Date of Patent: Mar. 21, 1989

[54] BALLTAPE STRUCTURE FOR TAPE AUTOMATED BONDING, MULTILAYER PACKAGING, UNIVERSAL CHIP INTERCONNECTION AND ENERGY BEAM PROCESSES FOR MANUFACTURING BALLTAPE

[75] Inventors: Rodney T. Hodgson, Ossining, N.Y.; Harry J. Jones, Austin, Tex.; Peter G. Ledermann, Pleasantville, N.Y.; Timothy C. Reiley, Ridgefield, Conn.; Paul A. Moskowitz, Yorktown Heights, N.Y.

[73] Assignee: International Business Machines Corporation, Armonk, N.Y.

[21] Appl. No.: 857,227

[22] Filed: Apr. 29, 1986

[51] Int. Cl.[4] .......................................... H02G 13/08
[52] U.S. Cl. .................................... 174/52.4; 357/71
[58] Field of Search ...................... 357/69, 68, 70, 71; 174/52 FP, 52 P, 52 H

[56] References Cited

U.S. PATENT DOCUMENTS

| | | | |
|---|---|---|---|
| 3,864,728 | 2/1975 | Peltz et al. | 357/69 X |
| 3,893,156 | 7/1975 | Riseman | 357/69 X |
| 3,943,556 | 3/1976 | Wilson | 357/69 X |
| 3,997,963 | 12/1976 | Riseman | 357/69 X |
| 4,336,551 | 6/1982 | Fujita et al. | 357/69 X |
| 4,363,076 | 12/1982 | McIver | 357/69 X |
| 4,516,149 | 5/1985 | Wakui et al. | 357/69 X |
| 4,607,276 | 8/1986 | Butt | 357/69 X |
| 4,631,820 | 12/1986 | Harado et al. | 357/69 X |
| 4,701,781 | 10/1987 | Sankhagowit | 357/69 X |

*Primary Examiner*—Thomas H. Tarcza
*Assistant Examiner*—John B. Sotomayor
*Attorney, Agent, or Firm*—Graham S. Jones, II; Daniel P. Morris

[57] ABSTRACT

Automated bonding of chips to tape and formation of bonding structures on Tape Automated Bonding (TAB) packaging structures are provided with bonding balls on the ends of beams leads of the TAB tape. Also balltape bonding balls are aligned on stacked TAB sheets and bonded together to form via interconnections through stacked balltape balls in multilayer, electronic packaging structures. Interconnection structures are provided for a universal chip connection laminate which can be applied between a chip and an MLC package. Area TAB tape, which comprises a modification of TAB tape provides balltape TAB connections by means of balltape bonds to areas within the interior of a chip whose leads are bonded in a TAB tape arrangement to the Inner Lead Bonds of the area tape.

25 Claims, 9 Drawing Sheets

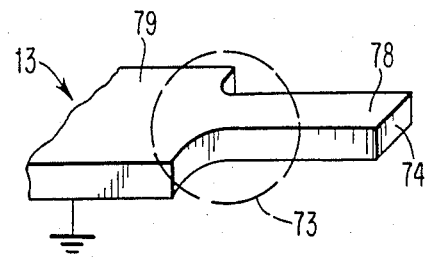
FIG. 11
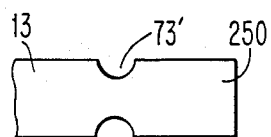
FIG. 12
FIG. 13
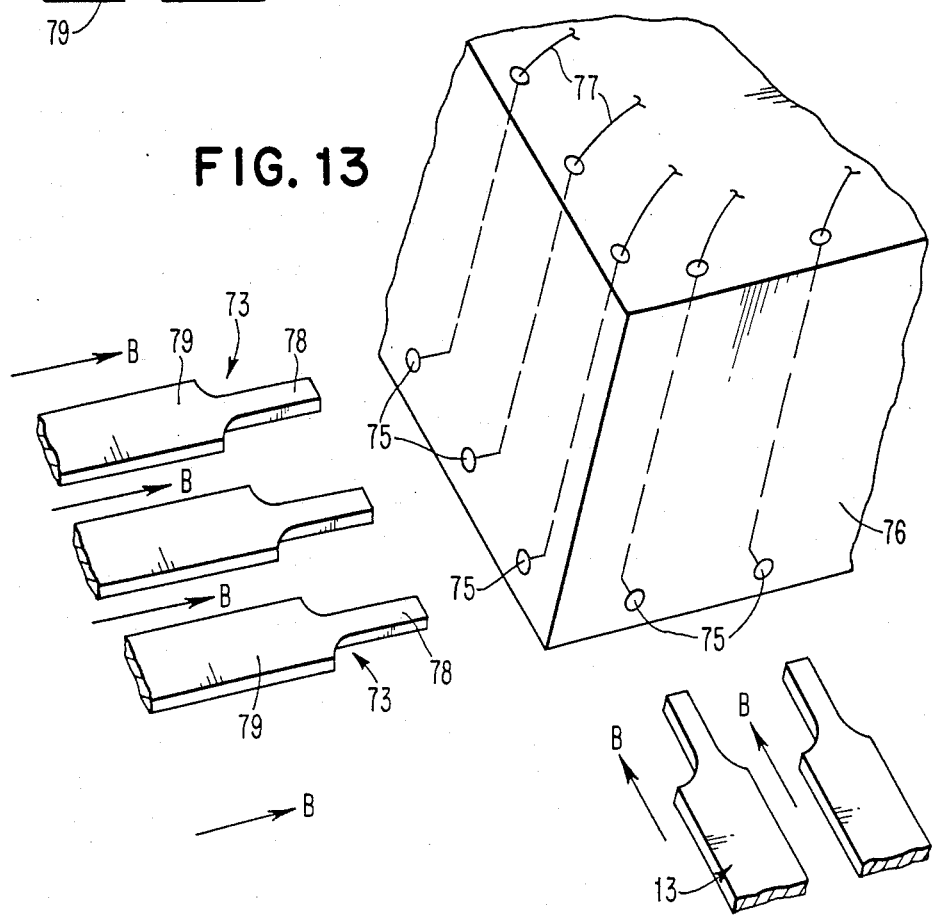

BALLTAPE STRUCTURE FOR TAPE AUTOMATED BONDING, MULTILAYER PACKAGING, UNIVERSAL CHIP INTERCONNECTION AND ENERGY BEAM PROCESSES FOR MANUFACTURING BALLTAPE

BACKGROUND OF THE INVENTION

1. Field of the Invention

The present invention relates to automated bonding of chips to a tape and more particularly to formation of bonding structures on Tape Automated Bonding (TAB) packaging structures. This invention also relates to interconnections in a multilayer, electronic packaging structure. Moreover, this invention relates to an interconnection structure providing a universal chip connection.

2. Description of Related Art
A. TAPE AUTOMATED BONDING

A few decades ago, a very popular form of packaging of semiconductor chips involved connections from a package by means of fly-wire leads which were attached from pads on a surface of the packaging substrate to pads on a chip supported by the package. The fly-wire leads were employed for electrical connection of a chip to an electronic system through the external connection pins of a wire-bonded package, such as a Dual In-line Package (DIP). Those pins are inserted into connections in the circuit board onto which the wire-bonded package is inserted. The fly-wire leads are applied between the pads on the chip and the pads on the leadframe inside of the wire-bonded package by means of an elaborate process of wire bonding. Fly-wire leads employed in the wire-bonded package are fragile and the bonds between the fly wire leads and the chip and the package are fragile. Fly-wire leads are about 0.025 to 0.050 mm in diameter. In addition, the fly-wire leads extend high above the chip and must be applied individually between each two points to which they are attached by a separate procedure of manipulation of each individual fly-wire lead and then a bonding procedure for both ends of each separate fly wire. Now packaging has evolved to the use of various more compact structures which require fewer steps in manufacturing, and which offer greater simplicity and reliability.

In contemporary, Very Large-Scale Integration (VLSI), electronic packaging systems, the approach of using fly-wire leads to connect between a package and pads on a chip is not as practical an approach, because with increasing density of circuits on a chip, and smaller pads, wires must be ever closer together because the number of wires to be joined per chip is increasing as the density of circuits increases. The pitch of pads on a chip is the distance pad center to pad center. While wire bonding can be performed with 25 micron wire (1 mil), a pradctical spacing limitation is wire bonding of about 2 mil pads with a 5 mil pitch. With such small dimensions, the problems of wire bonding are that the bonding tools are likely to damage adjacent bonds or wires.

Tape Automated Bonding (TAB) was developed almost two decades ago to make it possible to have thin, short beam leads supported and held in place by tape, with just the tips or ends of the beam leads extending from the periphery of the tape to a point just above the pads to which they are to be joined on the chip. In TAB, the beam leads extend over the chip pads on the periphery of the chip into a position in which they can be bonded by termocompression bonding. All of the leads are bonded with a single step operation in which a thermode, i.e. a heated platen, is heated to a high temperature. The hot thermode tool presses on te ends of the leads to bond them to pads below them on the chip. All that is required is that the pads and the leads should be in alignment, and that the leads of the package should be capable of coming into contact with the pads without any adverse effect upon the mechanical and electrical integrity of the leads. See Lyman, "Special Report: Film Carriers Star in High-Volume IC Production" Electronics, Dec. 25, 1975, pages 61-68, where at page 64, col. 2, the thermode temperature of the thermocompression bonding machine is listed as 550 deg. C., with a dwell time of 0.25 sec. and a bond force of 1.25 kg. Note that the range of temperatures for the bonding process falls between 300 and 700 degrees Celsius. C. D. Burns, in "Trends in Tape Bonding", Semiconductor International, April 1979, pages 25-30 describes subsequent developments in TAB. The typical pad pitch for TAB parts is 8 mils, with some commercial examples of 4 mils.

In the past it has been suggested that one should place metallization extending upwardly (outwardly) in the form of bumps on either the pads or the tip ends of the leads to allow for slight misalignment, to reduce the area of the bond, to reduce the complexity of the thermode design required for thermocompression bonding and to reduce the bending forces required to join the leads and the pads and to insure electrical contact only at the intended points. First, regarding the formation of such bumps on the electronic devices, one must use either an additive process of deposition or a subtractive process of etching or the like which requires extensive processing steps such as application of masks and removal thereof. Moreover, if chemical plating (or chemical etching) is involved in forming bumps on chips, the plating (or chemical etching) process employed may require the exposure of the chips to chemical treatments which may leave unwanted residues behind on the surfaces of the chips which may cause corrosion. J. Sallo, "Bumped-Beam Tape for Automatic Gang Bonding" Insulation/Circuits Vol. 25, No. 10 (1979) pp 65-66 makes it clear that it is difficult to apply the bumps to a TAB structure. Accordingly, there is a need for a system including structures and processes which will afford packaging without requiring the use of plated or etched bumps in connection with the pads of the electronic device.

Tape Automated Bonding (TAB) requires the use of either bumped chips or bumped tape to facilitate inner lead bonding (ILB) of the copper tape beams to the chip I/O pads. Processing of chip wafers to add bumps adds cost to the TAB process and presents a risk of damage to the chip wafers, especially for sensitive CMOS circuitry. Commercially available electro-deposited and etched bumped tapes is an alternative. However, the bumps on the beam ends of such bumped tape are mechanically hard and as a result of the mechanical hardness are capable of damaging the chip I/O pads or cracking the chip when force is applied during the bonding process. Commercially available bumped perimeter tape is more expensive than planar tape because it requires double photoresist processing and associated alignment.

An alternative approach to placing a bump on the electronic device is to fabricate a bumped structure on the TAB leads. This has been demonstrated for single-layer (all metal) TAB tape in which both sides of the tape are photolithographically processed. Single-layer tape has intrinsic factors which limit its application to chips having relatively few leads (I/O's). Furthermore, the all metal tape is untestable before mounting the device on the next level package. Thus, to provide the more desirable application of TAB to high I/O devices in a testable configuration, a means of fabricating bumps on 2 or 3 layer tape is necessary, since this type of tape is compatible with large numbers of I/O. As will be described below this bumping process for two-layer or three-layer tape is difficult.

Two or three layer bumped tape has been made by using a polymeric film coated on one or both sides with metal films. Bumped tape is difficult to fabricate economically from a two or three layer tape because of the problems of alignment and processing costs with the double photolithography required, plus the need to form holes in the polymeric layer as well. To manufacture a TAB product with the capacity of supplying a large number of I/O connections, one must use two or three layer tape because of the need for a polymeric support layer for the metallization.

U.S. Pat. No. 4,510,017 of Barber for "Testable Tape for Bonding Leads to Semiconductor Die and Process for Manufacturing Same" shows a bumped tape lead in FIG. 2 thereof which comprises a copper lead preferably, optimally plated with gold or tin. The patent discusses some problems of manufacturing TAB tape using conventional processes and teaches a method of forming bumped tape which is testable.

K. Hayakawa et al "Film Carrier Assembly Process", Solid State Technology Vol. 22, No. 3, p. 52 (1979) describes a version of bumped tape in which bumps are plated on a separate substrate and are transferred onto the tape for subsequent bonding to the electronic device.

U.S. Pat. No. 4,396,457 of Bakermans for "Method of Making Bumped-Beam Tape" discusses bumped-beam tape, and the problems of putting bumps on tape. The solution described in that patent is to microemboss the TAB tape to form the bumps in the TAB tape. The tape is composed of a copper foil which may or may not be laminated with a polyimide film which is etched to form circuit patterns forming beams. The tape has multiple punched registration or sprocket holes for advancing the tape through a manufacturing system. FIG. 6 of Bakermans shos a method of making bumped-beam tape, the polyimide of the tape is formed onto the copper and then the polyimide is etched to form personality holes. No adhesive layer is involved, however. In FIG. 7 of Bakermans, only a single layer of copper is involved. According to Bakermans, bumps are formed on the beams by means of one of two processes. 1. Punch a set of large personality holes in the polyimide for the bumps and beams to be formed in the metal layer. 2. Laminate the copper foil to the polyimide. 3. Punch the copper to form bumps. 4. Etch away the unwanted copper to form the beams with the bumps at the ends of the beams. 5. Plate the beams with gold.

The second process involves a different set of steps. 1. Punch a set of large personality holes in the polyimide for the bumps and beams to be formed in the metallic layer. 2. Laminate the copper foil to the polyimide. 3. Etch the copper to form beams. 4. Punch the end of each beam to form a bump. 5. Plate the beams with gold or another noble metal. It is clear that the Bakermans bumps are one-sided and hollow where they are punched. In the punched bump process of Bakermans or the bumped tape of Barber, supra, the bumps do not extend both above and below the beam.

Preferably, also, the bumps and the pads are of equal hardness as that gives the best deformation when forming a joint by thermocompression. Much of the prior art fails to provide equality of hardness between the metallic structures to be joined to the chips. Most TAB components in production use bumped chips, the manufacture of which involves a costly procedure that exposes the wafers to yield degradation caused by the wet chemical processing required. Moreover, adhesion of the bumps to the device metallurgy is frequently limited. In addition, there is the problem of irregular size and shape of the bumps formed by chemical treatments. Furthermore, to reduce the hardness of the plated bumps, which are usually made of gold, it is common practice to anneal the bumps, requiring exposure of the chips to periods at elevated temperatures.

Balltape

The polymeric Tape Automated Bonding (TAB) tape with electrically conductive leads terminating in balls adapted for bonding to pads on the chips in accordance with this invention, is referred to herein as balltape. Also this metal/polymer structure is able to be used to construct multilayer circuit substrates such as an MLC, printed circuit board of flexible circuit board structure.

European Published Patent Application Ser. No. 0,117,348 of Oakley et al, "Bonding Leads to Semiconductor Devices" published Sept. 9, 1984 shows in FIG. 5 thereof, as described at page 6, lines 9–13 the formation of "bumps on copper tape with a single pulse per finger . . . scanning the beam across a row of fingers." It teaches at page 4, lines 8–16, "a method of forming connecting bumps on the free ends of the conductive leads of a tape for use in the bumped-tape automated bonding process of connecting leads to a semi-conductor circuit device, includes heating the free ends of the leads on the tape by means of a laser beam to melt the ends of the leads so that surface-tension forces form the liquid-phase end of each lead into a ball, constituting the bonding bump." At page 6, lines 4–8 it states "the focus for the laser beam should be at or close to the surface of the leads or fingers. For some materials, an inert gas shield may be required."

B. MULTILAYER PACKAGING

Multilayer circuit packages containing numerous vias (which provide electrical interconnections between layers in the vertical direction) are used to connect numerous signal and power wires between electrical components used in the computer, communications, consumer, and industrial electronics industries. High density packaging is used where it is necessary to pack the components closely together employing many levels of circuitry with fine wire widths interconnected with vias. Materials used for substrates include epoxy/glass, ceramics and polyimide. Some circuits require as many as twenty or more layers of wiring. As the density of integrated circuits increases, along with the advent of reduced size surface mount packages, the need for reliable, low-cost multilayer substrates increases.

In the past vias have been difficult to manufacture in various multilayer packages, because of the numerous process steps involved. The normal manufacturing process for flexible multilayer circuits requires that the interconnecting vias be made in the same manner as they have been made for many years in the epoxy/glass substrates. That is, one drills the via holes, then seeds the holes with an appropriate metal, and plates copper into the holes by an electroless plating process. The final process steps then include etching of discrete conductor lines and laminating the various layers together, and again repeating the above steps for interconnecting subsequent layers with the previous layers by means of additional vias ih the later added layers.

C. UNIVERSAL CHIP INTERCONNECTION PACKAGE

In the past, multilayer substrate packages with non-repairable defects have been discarded because of the lack of suitable repair techniques. Reasons for this include the inaccessibility of internal defects and an insufficient number of engineering change (EC) pads. Such substrates are generally designed either for flip-chip solder mounting as is the case for multilayer ceramic (MLC) or exclusively for plastic-packages containing wire-bonded chips. It has not been possible to substitute one chip type for another. U.S. Pat. No. 4,489,364 of Chance et al for "Chip Carrier with Embedded Engineering Change Lines with Severable Periodically Spaced Bridging Connectors" is just one example of work which has been done to deal with the problem of engineering changes in the past.

D. ADDITIONAL RELEVANT PUBLICATIONS

A paper dated June 11, 1984 entitled "Nikkei Special 1 Assembly of the Next Generation VLSIS, Aluminum Ball Bonding to Connect as Securely as Gold Wires" by M. Suwa et al Nikkei Electronics Microdevices, June 11, 1984 describes formation of balls on the ends of fly-wire leads used for conventional wire bonding of fly-wire leads to IC chips. This is well known, as shown by Suwa et al. The Al balls are formed "instantaneously by imparting a large power to aluminum wire in an atmosphere of argon containing hydrogen." That atmosphere comprises forming gas. The technique used also involved using a high voltage of 1000 V applied no longer than 7 ms with a current of at least 1 Amp. There is no suggestion of the use of the process in connection with TAB or the use of a laser to form the balls.

At page 5, it was stated "a large number of researchers have tried to develop the ball at the tip of aluminum wires by using laser beams, microplasma torch, or short circuit discharge . . . . However, nowwhere could a ball be formed that could compare with the gold balls."

A paper entitled "The Development of Copper Wire Bonding for Plastic Molded Semiconductor Packages" by J. Hirota, K. Machida, T. Okuda, M. Shimotomai, and R. Kawanaka, IEEE pages 116–121 (1985) discusses replacement of gold wire bonding with copper wire bonding of semiconductors to plastic based packages. The article, which does not relate at all to TAB shows (on page 116) a schematic diagram of apparatus for forming a ball on the end of a wire of Al, Cu or Ag by use of a laser beam directed at the end of the wire set in a chamber with an atmosphere containing a shielding gas. It is stated on page 11, Col. 1 under "Ball Bonding Technology" that copper balls are slightly harder than gold, and that making the copper softer so as not to damage a Si chip is a problem. The pads being used on the chips were aluminum pads. Note that an oxygen detector is shown in FIG. 1 of the paper and that argon is used in FIG. 3 where the oxygen content is listed. The smoothness of a copper ball is shown for low oxygen. The presence of a reducing atmosphere is not shown.

U.S. Pat. No. 3,614,832 of Chance et al shows, in FIG. 7 thereof, a laser beam passing through the back of a polyimide decal 19 (Col. 5, lines 45–51) carrying conductor leads 20 to bond the lead 20 to land 13 on a substrate 11. The lead is to be connected to the contact 17 on the chip 15. No suggestion of formation of balls at the ends of the leads prior to bonding is made. In addition, this decal wiring arrangement is significantly different from the TAB structure.

U.S. Pat. No. 4,188,636 of Sato et al describes an arrangement in which the bumps are formed on the semicondutor chip rather than on the beam leads on the TAB packaging structure.

U.S. Pat. No. 3,463,898 of Takaoka et al "Welding Device Using Laser Beams" shows (in FIGS. 2A and 2B thereof) that the end of a wire electrode to be welded by a laser beam can be in the form of a ball. The patent states "In this constructions, it is desirable to form the top end of a lead wire 4 into a ball of larger diameter than the bore of the nozzle center hole as shown in FIG. 2A so that its length will never change when touched on the electrode surface . . . " Col. 3, lines 60–65.

U.S. Pat. No. 3,934,073 of Ardezzone "Miniature Circuit Connection and Packaging Techniques" shows in FIG. 5 shining a high energy beam through the glass block 14 to bond pads 23b of a semiconductor device to lead ends 11b and 11c of a preform. Preferably the beam is a laser beam. Col. 6, line 26-Col. 7, line 12.

U.S. Pat. No. 4,510,017 is a background patent which discusses both bumped-beam tape and TAB. Leads 14 therein have bumps 18 plated on the inner lead ends thereof. Leads 14 are formed of copper and are plated with bumps composed of solder, Ni, Sn or Au. Gold and nickel bumps are hard unless annealed. Such hard bumps can damage the tape. Tin or solder bumps have a limited shelf life problem. Secondly, they are nonuniform in size. Thirdly, they require precision mask alignment. Fourthly, the bumps extend downwardly, but they do not extend upwardly. Fifthly, it is costly to plate up a bump. Sixthly, the plating bath is not likely to create a clean surface. The etching or the formation of the bump from the copper layer can be done, with either step occurring first.

Hard gold bumps are less easily deformed in thermal compression bonding and as a result, they result in less reliable joints. Toward that end, it is a standard practice in the art to anneal hard gold bumps for the purpose of softening them. However, no reports have been found in the published literature of the use of lasers to anneal gold bumps. The problem of hard bumps on chips or beams is aggravated as the lead count goes up resulting in a greater total force on the chip. Therefore, potential excessive load is applied locally due to irregularities in the geometry or a lack of planarity. In the past those skilled in the art have been aware of the problem that "hard" gold plated bumps might damage silicon chips. It is standard practice in the semiconductor chip packaging industry to heat gold wires to form balls for wire bonding of fly wires stitched to chip pads by using wire bonding procedures. But it is a relatively new procedure to use balls on the tip ends of the leads in TAB bonding, as taught by Oakley et al. Instead, bumped tape or bumped chips have been used to connect chip pads to TAB leads. Howvever, bumped tape does not provide sufficiently soft material for satisfactory use with chips. The hard bumps may damage the chips. The bumped tape is heated by means of a heated platen (like an iron) which is known as a "Thermode" which is used in thermal-compression bonding. Alternatively, one can used so called "bumped chips" but that involves a process of exposure of the chips to harmful plating baths or the like to form bumps on the pads of the chips.

SUMMARY OF THE INVENTION

In a process in accordance with this invention, such balls are formed on the ends of TAB leads to produce balltape by means of an arc process. One process used to form such balls is to heat the metallic beams near the point where the ball is to be formed with an arc in a reducing atmosphere such as forming gas (10% hydrogen in argon or nitrogen gas, or 4% hydrogen in nitrogen gas.) The reducing atmosphere is used to remove oxygen from the lead being formed into a ball or to avoid oxidation of the ball. By means of this process, a soft copper ball is formed as contrasted with a hard metal bump. The copper is softer than some forms of copper because it is not work-hardened nor fine-grained (as is common with plated material.) In addition, the balltape process which is performed in forming gas leaves the surface clean and oxide free. This surface is superior for plating or direct bonding. Also, the balltape is soft. The punched bumps (See Bakermans U.S. Pat. No. 4,396,457 supra) are made from a material that is hard to begin with and may be further work hardened by the punching process.

A. AREA TAPE

Bumped area tape which provides connections to both the leads on the pads on the periphery of the chip and between sites on the interior of the chip is desirable to provide connections to the pads on the interior of a chip, without having to employ engineering change fly-wires. In area tape the ball extends above and below the beam and in the case of TAB tape with balls formed within openings in the (polymeric, i.e. polyimide) substrate on which the conductive beams are supported, the balls extend above and below the opposite surfaces of the substrate.

Tape wiring in the middle of an area on the polyimide tape can be formed into balls after first removing some of the polyimide where the balls are to be formed. Based on experience in laser processing, a unique advantage of the instant invention is the uniformity and reproducibility of the laser-formed structures. Work in using lasers for etching plastics and ceramics, and in the use of lasers for soldering applications shows that it is difficult to obtain a uniform result using a laser. This usually results from differences in the surface characteristics of the piece to be worked and also from unavoidable fluctuations in the intensity of the laser. This process is capable of overcoming the problem of such intensity variations as is explained below.

The balltape process produces soft, uniform bumps that do not require bumped chips. Nor does the balltape manufacturing process involve the difficult double alignment process required to produce bumped tape. The potential for bumped-copper, polyimide tape, as well as area-bumped tape, is realized by the balltape process.

Laser manufacturing and machining processes, with which we are familiar often require that either the laser power or the total energy delivered fall within a narrow window. The balltape TAB process of the instant invention has the marked advantage that it is insensitive to such parameters once a certain minimum laser power threshold has been reached. The self-limiting nature of the process makes it insensitive to an excess application of laser power, below unusually large power density levels at which vaporization will occur. Also, the uniformity of the structures formed is relatively insensitive to the linear dimensions of the TAB beams that are to be formed, since the diameter of the ball formed varies as the cube root of any one of the linear dimensions. For example, a variation in the thickness of the beam by 10.0 percent will result in a variation of the ball diameter of only 3.2 percent.

At the same time, it is significant that although the melting point of copper is 1083 degrees C. and polyimide may begin to be carbonized at 450 degrees C., there is no damage observed in the polyimide film which is attached to the copper beam less than 0.040 inches from the end of the beam which has been melted by the laser or arc process. The self-limiting characteristic of the laser process plays a role in limiting the time required to complete the process and thus limits the total energy transfer to that which is needed to complete the process.

The soft spherical bump produced by the TAB package with balls on the ends of the beams known hereinafter as balltape is an improvement in two ways. The softness of the balltape bump will allow bonding without danger of damaging delicate thin film structures on the chip, and the ductility of the bond produced may lengthen the life of the bond when it is exposed to stress. We have discovered that the extension of the balltape bump both above and below the polyimide structure make Area tape TAB possible as shown in FIG. 3 as described below, as opposed to current practice which concentrates on peripheral array TAB, without the necessity of a personalized thermode in which the load is applied only at small bumps on the thermode. This personalized thermode approach requires much more careful alignment to avoid charring adjacent polymeric material and increases the expense and uniqueness of the thermode. For TAB bumps extending above and below the polymeric substrate, a flat unpersonalized thermode may be used.

Balltape differs from bumped tape in that the beam ends are composed of soft copper while bumped tape has hard beam ends. This softening arises primarily from the grain coarsening which occurs during the ball formation process. This is a unique attribute of this process since the temperature necessary for grain growth is well in excess of the maximum temperature to which the polymer carrier may be subjected. The beams of balltape are preferably composed of a metal such as hard copper excpet for the balls, which are softer. This helps to maintain proper position during handling. The soft spherical balls at the beam ends may be compressed during a thermocompression bonding process with reduced risk of penetrating the soft aluminum I/O pads or the cracking of any brittle elements of the device structure, such as passivation layers. Balltape can be produced by means of an inexpensive one-step modification of standard planar tape.

An electronic package overlay (110) provides TAB bonding combined with area connections on a chip (112) The overlay (110) comprises a substrate (107) of an insulative material, the overlay carrying at least one metallic tape beam lead (13) and at least one bridging-beam lead (88) having balltape balls (9) at each of its ends. An edge (89) of the substrate (107) is provided. A plurality of openings (15) in the substrate (107) are aligned with pads on the chip (112). The overlay substrate (107) supports the beam lead (13) so that a portion of the beam lead (13) extends into the opening (15) and the ball being bonded to the pad on the chip (112). The beam lead (13) extending across the edge (89) of the substrate (107). One of the conductor pads is juxtaposed with the ball (9). The bridging-beam lead (88) is terminated in balls (9) at each end thereof and is bonded to a pair of pads on the chip (112) through openings (15).

An electronic package overlay includes an electronic chip (112) with pads thereon. It is electrically and mechanically bonded to the leads on the overlay by means of a solid ball connections between the pads on the chip and the beams on the overlay.

An electronic package overlay provides TAB bonding for modifying a packaging structure combined with area tape comprising a chip (12). A packaging structure (133) including pads (39, 82) thereon and circuit lines therein. A chip overlay substrate (10C) connects between the chip (12) and the structure (133). The overlay substrate (10C) comprises a layer of an insulative material. The overlay substrate (10C) carries at least one metallic tape beam lead (13C, 81). The overlay substrate (10C) has at least one opening therein (215, 315) aligned with a pad (39, 82) on the structure (133). The overlay substrate (10C) supports the beam lead (13C, 81) so that a portion of the beam lead (13C, 81) extends into the opening (215, 315). The beam lead (13C, 81) terminates in a solid ball (238, 338). The ball extends above and below the substrate (10C) into the openings (215, 315).

The ball (238, 338) is bonded to the pad (39, 82) on the structure (133). The chip (12) includes a pad (236) thereon which is electrically and mechanically bonded to the lead (13C) of the overlay (10C) by means of a bond of a the solid ball (38) on the beam lead (13C) connected between the pad (236) on the chip (12) and the beam (13C) on the overlay (10C). Preferably the electronic package overlay includes a bridging-beam (81) providing internal connections between at least a pair of pads on the chip (12). In another aspect, the electronic package overlay includes a solder ball (225) providing a connection between a pad (234) on the chip (12) and a pad (35A) on the structure (133) through an opening (226) in the substrate 10C.

Preferably, a solid ball (38) is connected by a beam to a plurality of terminals on a chip (12).

B. MULTILAYER PACKAGING

In another aspect of this invention a multilayer package is constructed using balltape leads bonded to similar leads in a plurality of layers of the package. The bumps on the leads in the various layers which are preferably balltape bumps facilitate the interconnection of the leads.

What is now proposed is a simple process for the production of vias by the use of the laser process to produce the structure referred to as balltape elsewhere herein. The process steps now require that the polyimide material be either etched, punched, or drilled to provide holes in the polyimide, and then the copper cladding laminated onto the resulting structure in the normal manneer used to produce a circuit substrate. Alternatively, a planar polymeric structure having patterned copper structures applied by lamination, or plating, may then be etched.

Then the circuit pattern is etched again in the normal manner. The laser or other focussed energy process, now used as a heating process of the instant invention is employed to create the balltape structures at the appropriate positions, with the improved and important feature that the balls are of sufficient diameter to protrude both above and below the surfaces of the polyimide carrier. Then two such layers of circuitry employing balltape balls are aligned in a normal process step for multilayer circuits. The balls are bonded together by an appropriate process. Appropriate bonding processes include thermocompression bonding, spot welding, or the use of a low temperature solder. Additional layers are then added in much the same manner. The balls produced by the balltape process also allow bonding of a ball on one level of circuitry to be bonded to a land on another level.

C. UNIVERSAL CHIP CONNECTION

In another aspect of this invention, a modification is possible wherein chips of different types can be added to a substrate. Different types of chips such as flip-chips soldered to a substrate with C-4 connections, as well as Al-Cu pad chips can be used on substrates designed for use with a various types of chips. In addition, EC pads can be added to allow the repair of otherwise non-repairable substrates or the substitution of new chip designs on previously existing substrates where that capability did not exist previously.

In accordance with this aspect of the invention, a multilayer packaging structure for electronic devices comprises a via structure for interconnection of electrical conductors on different levels in a package. The structure includes at least one metallic tape beam lead (13B), and a substrate (26) comprising a film of an insulative material. A first opening (29) is provided through the substrate (26). The substrate (26) supports the beam lead (13B) so that a portion of the beam lead (13B) extends across a portion of the first opening (29). The beam lead (13B) terminates in a solid first ball (9B) extending above and below the substrate (26) through the first opening (29). A second substrate (27) is composed of an insulative material stacked with respect to the first substrate (26). The second substrate (27) including a second opening (30) therein aligned with the first opening (29) in the first substrate (26). The second substrate (27) carries a second beam lead (13A) terminating in a second ball (9A) extending through the second opening (30) and the second ball (9A). The first ball (9B) is juxtaposed with and bonded to the first ball (9A), whereby a via is formed.

In another aspect of this invention, a multilayer packaging structure for electronic devices comprises a via structure for interconnection of electrical conductors on different levels in a package including at least one metallic tape beam lead (13B), a substrate (26) comprising a film of an insulative material, a first opening (29) through the substrate (26), the substrate (26) supporting the beam lead (13B) so that a portion of the beam lead (13B) extends across a portion of the first opening (29). The beam lead (13B) terminates in a solid first ball (9B) extending above and below the substrate (26) through the first opening (29). A second substrate (34) composed of an insulative material is stacked with respect to the first substrate (26). The second substrate (27) includes a pad (33) thereon aligned with the first opening (29) in the first substrate (26). The first ball (9B) is juxtaposed with and bonded to the pad (33). Thus a via is provided between conductive patterns on the first and second substrates (26, 34). Preferably, the structure includes a ground plane (131) between a pair of the substrates (26, 132).

D. BALLTAPE STRUCTURE

A tape for use in a tape automated bonding of electrically conductive, metallic tape beam leads to pads of integrated circuits, includes several features. A substrate comprises a carrier comprising a film of a polymeric material formed with a plurality of frames defined by openings therethrough. The carrier supports a plurality of the beam leads so that a portion of each of a plurality of the beam leads extends across a portion of the opening. The beam leads terminate in solid, metallic, conductive balls extending above and below the polymeric material through the frame.

The balls are coated with a bondable film of a metal selected from the group consisting of Au, Pd, Sn, Ni, Pb containing solders and In containing solders.

In accordance with this invention a process for fabricating tape automated bonding materials, includes providing polymeric tape having first and second surfaces carrying leads in the form of metallic conductor beams on one of the surfaces. The metallic conductor beams include terminal ends. An electric arc is directed at the terminal end of a metallic conductor beam to form a ball at the terminal end.

Further in accordance with this invention, a process of fabricating tape automated bonding materials in accordance with this invention includes providing polymeric tape having first and second surfaces carrying leads in the form of metallic conductor beams on at least one of the surfaces. The metallic conductor beams include terminal ends. The beam has a smaller cross sectional area in a locus proximate to a terminal end prior to heating of the metallic conductor beam with the focussed energy. One directs focussed energy at a the terminal end of a metallic conductor beam to form a ball at the terminal end.

Preferably, the source of focussed energy is applied by step of directing the energy at a the terminal end of the metallic conductor beam in the presence of a reducing gas atmosphere to form a ball at a the terminal end of a the metallic conductor. Another preferred feature is that the focussed energy comprises a laser beam. A further preferred aspect of the preferred embodiment is that the focussed energy is applied by an electric arc by the step of establishing an electric arc with the terminal end of the metallic conductor. It is also preferred that the energy is applied in the presence of an inert or a reducing gas atmosphere to form a ball at a the terminal end of a the metallic conductor.

Preferably, the electric arc is directed at the terminal end of the metallic conductor in the presence of a magnetic field whose field lines connect the end of the metallic conductor with the source of the electric arc.

The ball is preferably coated with a metal selected from the group consisting of Au, Pd, Sn, Ni, solders of Pb and solders of In.

The foregoing and other objects, features and advantages of the invention will be apparent from the more particular description of the preferred embodiments of the invention, as illustrated in the accompanying drawings.

BRIEF DESCRIPTION OF THE DRAWINGS

FIG. 10 also illustrates the additional optional processing capability in which the metallic structure is plated with another thin metallic layer, e.g. Au or Sn, after the laser processing step.

FIG. 11 shows a balltape beam prior to machining to form a ball on the end of the beam with an electric arc. The structure is an alternative to a standard uniformly cross-sectioned beam. The structure shown in FIG. 11 requires no additional processing steps beyond those currently required for planar tape.

FIG. 12 shows an alternative design for the beams of FIG. 11 with a notch introduced in the beam forming a narrow waist which limits the melting of the beam when heated by an energy beam to the mass desired.

FIG. 13 shows an array of beams may be arc melted by an electrode of the appropriate geometry. Insulators may be used in the electrode to assure that all the beams to be arc-formed experience the same density of electric field, and that individual arcs are struck to each lead.

In the drawings, like elements are designated with similar reference numbers, and identical elements in different figures are given the same reference numbers to avoid complexity of the numbering system.

DESCRIPTION OF THE PREFERRED EMBODIMENT

Figure 1:
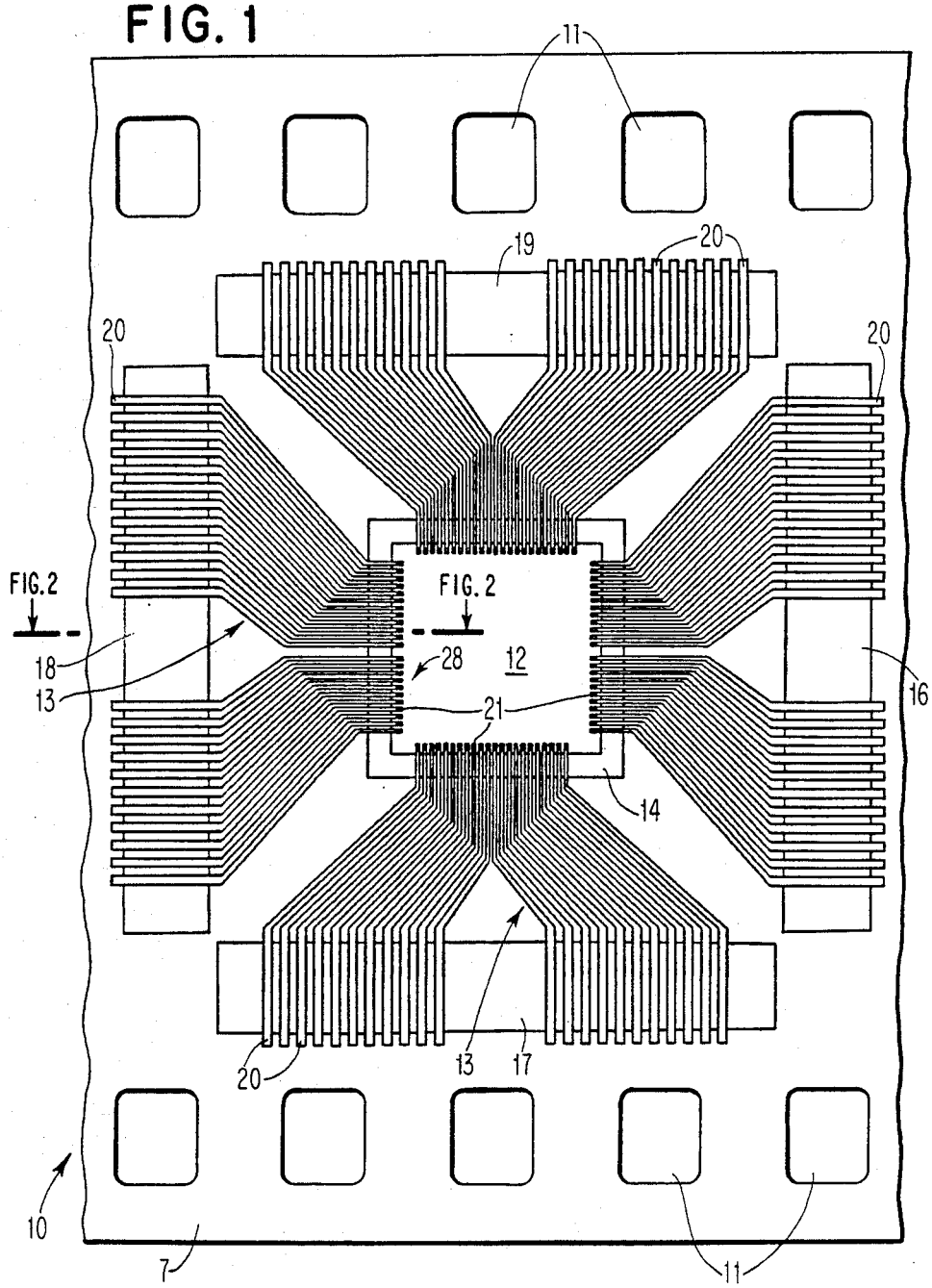
FIG. 1 shows a plan view of a chip bonded to a section of balltape before the outer lead bonds have been made.
Figure 2:
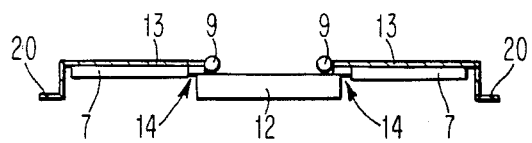
FIG. 2 shows an elevational view of the chip of FIG. 1 bonded to the balltape and the outer leads have been excised (from the polymeric substrate tape) and formed.

Disclosure of the Invention, Best Mode and Other Modes of Carrying Out the Invention In FIGS. 1 and 2, an LSI circuit chip 12 is supported by a packaging tape 10 composed of a polymeric substrate 7 preferably composed of polyimide film coated with a film of metal from which conductive beams 13 are formed. Tape 10 is shown with the chip 12 located below the substrate 7 of tape 10. The polymeric Tape Automated Bonding (TAB) tape 10 with conductive leads terminating in Inner Lead Bonding (ILB) balls 9 adapted for bonding to pads on the chips 12 in accordance with this invention, is referred to herein as balltape. The balltape 10 includes the substrate 7 which comprises a polyimide film onto which is bonded a pattern of copper, partially formed into conductor beams 13. Beams 13 are shown surrounding the chip 12. The tape 10 is in the form of a 35 mm wide tape, similar in configuration to a 35 mm photographic film. Tape 10 has sprocket holes 11 for use in reeling and unreeling the tape 10 and feeding the tape 10. The metallic pattern of conductor beams 13 on the substrate 7 is thus fed to a position aligned properly with a machine for TAB (Tape-Automated Bonding) of the soft, copper, ball-shaped ends 9 of conductive beam leads 13 on the tape 10 to aluminum (or coated aluminum) conductor pads 21 on the chip 12. Thus balls 9 connect the conductor pads 21 to the balltape beam leads 13 supported on the substrate 10. Leads 13 are bonded at the Inner Lead Bonding (ILB) ends 21 of beam leads 13 adjacent the chip 12 for thermocompression bonding of balls 9 to the pads 21 on the chip 12. Tape 10 has a square window 14 therein (aligned to frame the chip 12) beyond which the balls 9 on the ILB terminal ends of leads 13 extend downwardly so that they can reach down to the pads 21 on chip 12 below for connection thereto. The opposite ends of the leads 13 are the Outer Lead Bonding (OLB) ends 20 of the beams which extend over windows 16, 17, 18 and 19 in the tape 10 so that the opposite ends of the leads 13 can be joined to a packaging chip carrier or substrate, not shown. The outer OLB ends 20 of the leads 13 are normally cut from the tape 10 at the windows 16-19 so that they can be bent and joined to a chip carrier by solder joining or the like.

Figure 3:
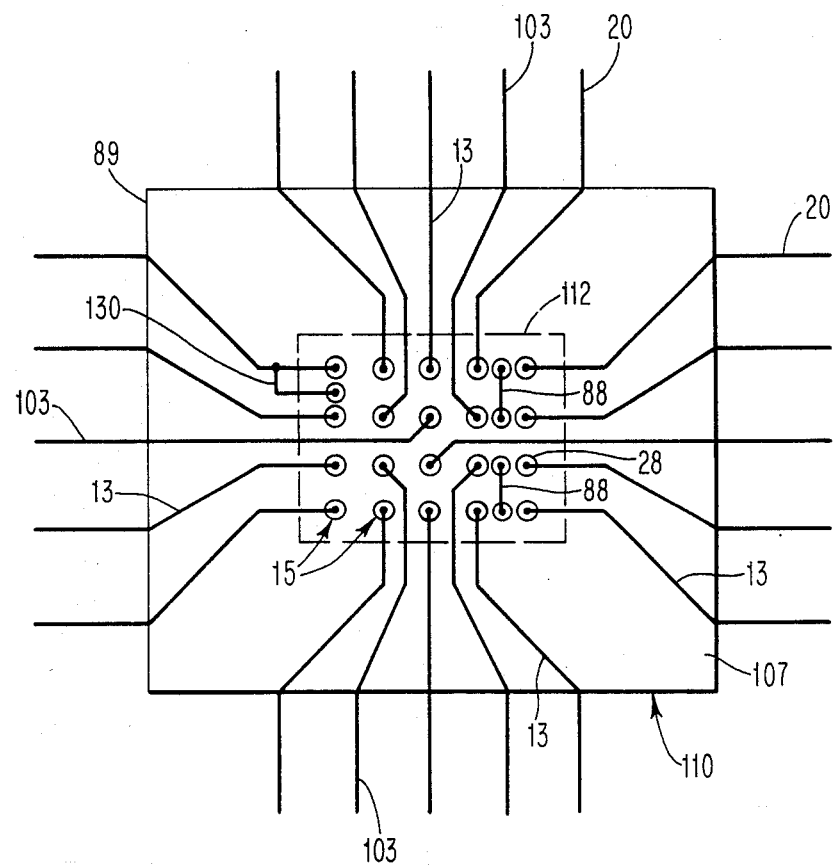
FIG. 3 is a schematic plan view of area balltape adapted to be bonded to a chip for connecting the various pads on a chip with balltape bonds both at the periphery as with normal TAB connections and internally of the chip using the balltape to bridge across the chip.
Figure 10:
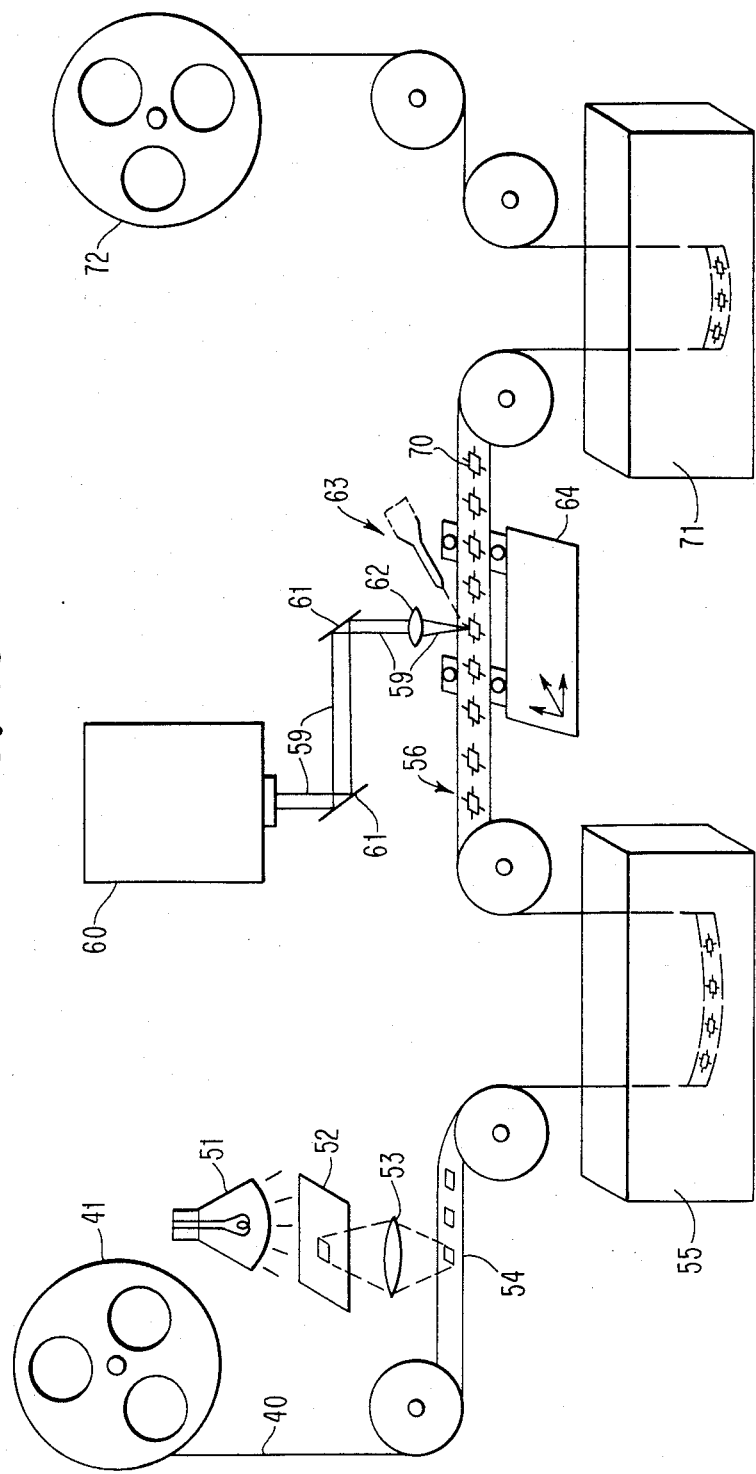
FIG. 10 shows a schematic of a processing system for forming the balltape of FIGS. 1 and 2, in accordance with this invention. A raw (unexposed tape) tape feed reel carries unexposed, blank polyimide tape carrying a film of copper which is coated with a thin film of an unexposed photoresist.

FIG. 3 shows an Area Tape or area balltape structure 110 adapted to be bonded to a chip 112 (shown in phantom since the tape covers the chip.) Area tape 110 is adapted for connecting the various pads on the chip 112 from beams 13 through holes 15 in the polymeric substrate 89 with balltape bounds both to pads 28 at the periphery of the chip 112 as with normal TAB connections and internally of the chip. Area tape 110 makes these connections using new conductive bridging-beams 88 terminated with balltape balls 9 to bridge across the chip 112 between two ILB pads on the chip 112 to make engineering changes without having to use fly-wire connections. The area balltape 110 is simply excised from a carrier tape (as shown in FIG. 10 and described below in connection therewith.) The balltape 110 is bonded to the chip 112 in the same way as in FIGS. 1 and 2. However, the inner pads on chip 112 are interconnected without having to use any special handling and manipulation of engineering change wires to makethe connectins which can be performed with ordinary TAB alignment and bonding procedures. Since the balls 9 extend above the tape, the thermode can make the bond in the same way as with the Inner Lead Bonds ILB 28. Outer Lead Bonds are made at the outer ends 20 of beams 13.

To recapitulate, FIG. 3 shows an area tape 110 provided for use in a combination of TAB bonding to a chip 112 and inteconnecting between pads on the chip 112 using balltape 110. This structure uses the polymeric film of an insulative material, i.e. substrate 107 in the fom of an overlay. The substrate 107 carries at least one metallic tape beam lead 13 and bridging lead 188. The overlay 107 has edges 89, and the overlay supports the beam leads 13 so that a portion of each beam lead 13 extends across a portion of one of the edges 89. Each beam lead 13 terminates in a solid ball extending above and below the substrate across the edge 89. The electronic chip 112 includes pads thereon which are electrically and mechanically bonded to the tape overlay 110 by means of a solid ball connection between the chip 112 and the tape overlay 110, with bridging beam leads 88 providing internal connections between at least a pair of pads on the chip 112. It is shown also that a single beam lead 130 may branch and make multiple connections to the chip 112, as would be common with power or ground connections.

Figure 4:
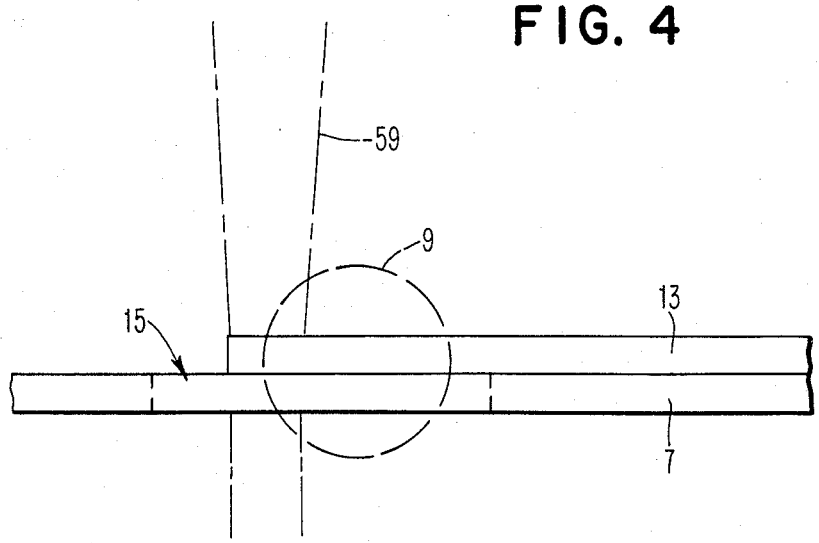
FIG. 4 shows a focussed laser beam forming a balltape ball on the end of a copper beam on a polymeric substrate of a TAB tape, shown, in this case, as area balltape.

FIG. 4 shows a focussed laser beam 59 directedat a copper beam 13 on the end of a copper beam on a polymeric substrate 7 of a TAB tape for the purpose of forming a balltape ball 9 on the end thereof.

We have demonstrated balltape production with power densities of 100 kw./sq. cm. An investigation by P. B. Perry, S. K. Ray, and R. Hodgson, Thin Solid Films, V. 85, pp. 111-117 (1981)) reveals that where a YAG laser has been used to vaporize copper lines, that power densities of 100 M to 1000 Mw/sq. cm. are required for vaporization. This indicates that the power density processing window for balltape manufacture may extend over three orders of magnitude.

Figure 5:
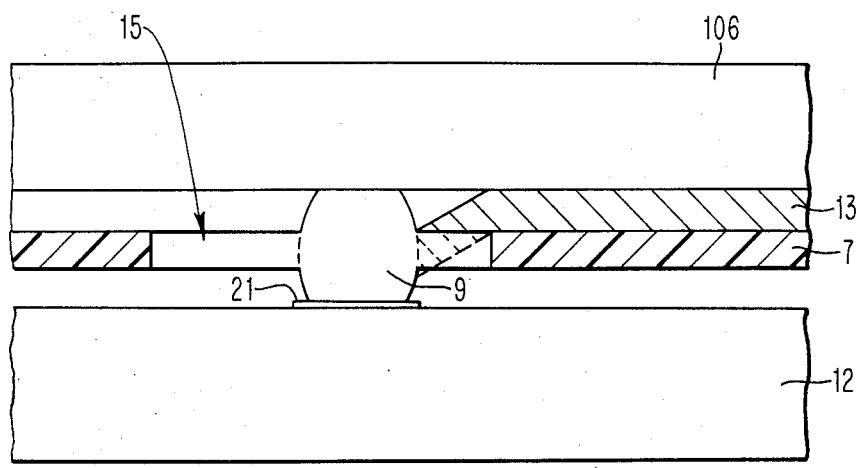
FIG. 5 illustrates the bonding of the balltape ball of FIG. 4 after thermocompression bonding by a thermode.

FIG. 5 illustrates the bonding of the balltape ball 9 of FIG. 4 after thermocompression bonding by a flat heated thermode 106 in accordance with the state of the art.

Figure 6:
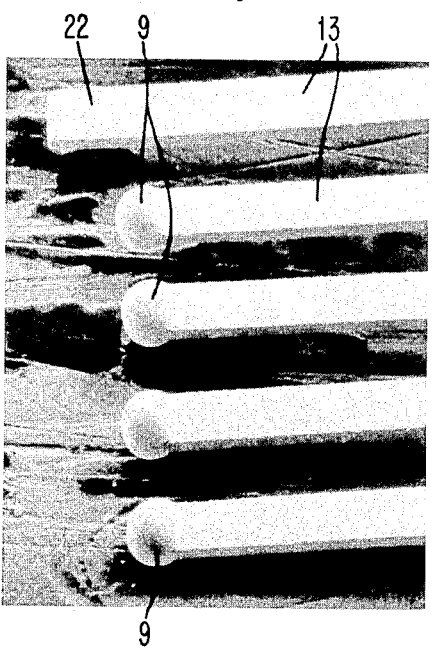
FIG. 6 shows a Scanning Electron Microscope (SEM) photograph of an array of conductive beam leads with all but one terminating in bonding balls of copper.

FIG. 6 shows a photograph made with a ScanningElectron Micrograph (SEM) of an array of leads 13 with all but one terminating in bonding balls 9 of copper. The balls 9 are adapted to be bonded to pads on a chip. The one beam lead 13 is terminated at 24 as all of the leads were prior to treatment with a laser beam to form a ball on the end thereof, in accordance with the process of this invention. The contrast between the leads terminating in balls 9 and the lead terminating at Inner Lead Bond (ILB) end 22 shows how the leads shrink back from the laser beam when exposed to a focussed laser or other energy beam.

Figure 7:
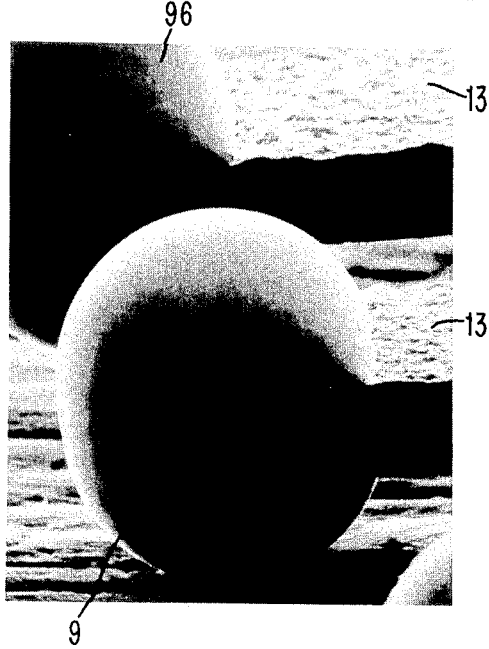
FIG. 7 shows a photograph from an SEM, projecting an enlarged view of two balls on adjacent leads, formed by laser processing in accordance with this invention.

FIG. 7 shows a photograph from an SEM, projecting an enlarged view of two balls 9, on leads 13, formed by laser processing in accordance with this invention.

Figure 8:
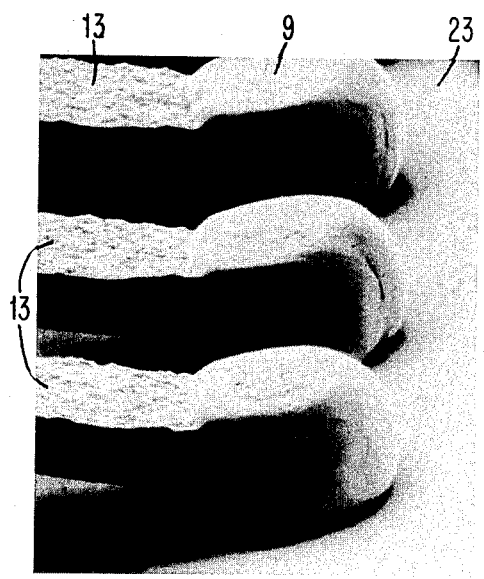
FIG. 8 shows similar photographs of a set of leads and balls which have been bonded by thermocompression bonding to a pad.

FIG. 8 shows similar photographs of a set of leads 13 and balls 9 which have been bonded by thermocompression bonding to a pad 23. There are two advantages of the balltape in thermocompression bonding which arise from the non-uniform crushing of a sphere: When the thermode (the bonding tool) contacts the balls the stress at the pad-ball interface is very high since the contact area between the sphere and the pad is small. Thus, during the initial stages of ball crushing much higher stresses (compared to a flat lead contacting the pad)are generated for a given load which facilitates local bonding. For a flat lead much higher loads, which may be potentially damaging to the chip must be employed to generate similar stresses. The second advantage arises from the localized plastic deformation.

Figure 9:
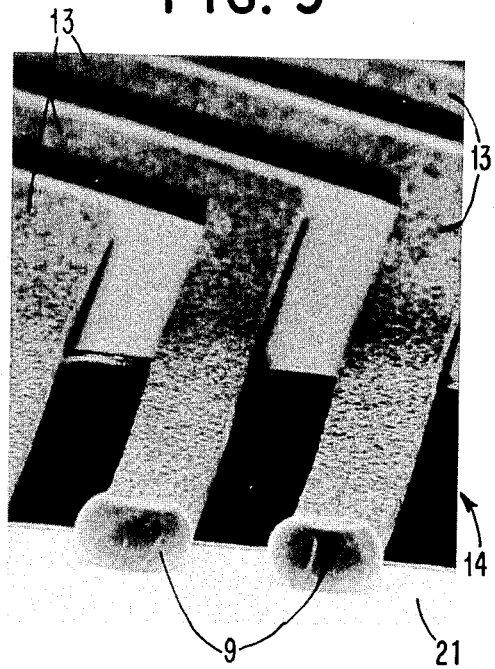
FIG. 9 shows beams crossing from the tape across a window in the polymeric substrate to a connector pad on the chip to which the balls on beams are bonded by thermocompression bonding.

FIG. 9 shows beams 13 crossing from tape 10 across window 14 to pad 21, to which the balls 9 on beams 13 are bonded by thermocompression bonding.

FIG. 10 shows a system for forming the balltape 10 of FIGS. 1 and 2, in accordance with this invention. A raw tape feed reel 411 carries polyimide tape 40 laminated with a film of copper which is coated with a thin film of a photoresist. The tape 40, which has sprocket holes as in FIG. 1, is advanced into a position under a photoresist exposure lamp 51 which shines through the mask 52 and les 53 to provide an image 54 formed on the tape 40. That completes the process of exposure of the tape 40. Then the tape passes into bath 55.

The development and etching bath 55, (preferably two separate baths as will be understood by those skilled in the art, but shown as one bath, for convenience of illustration) treats the exposed photoresist to develop the pattern. The surfaces of the copper exposed by the pattern of the developed photoresist exposed is etched away by the bath 55, leaving the beam leads 13, which were covered by the remaining photoresist.

The completed planar tape 56 passes under the scanned or pulsed laser unit 60, which emits a beam 59 reflected by mirrors 61 through focussing lens 62 onto the beams 13 to form balltape balls 9 on the ends of the beams 13. The formation of the balltape balls 9 by the laser is a self-limiting process. The tip ends of the beams 13 on the conventinal planar tape are melted by the focussed laser radiation. The melted ends of beams 13 form liquefied copper balls 9 as they withdraw from the path of the laser along the TAB beam, thus limiting the process since the beam cannot be heated once the liquefied ball 9 has withdrawn from the beam. For a one ounce, 35 micrometer thick copper beam 100 micrometers wide, a 3.0 mJ fluence is sufficient to fuse a 200 micrometer long beam end into a 110 micrometer diameter sphere 9. The quick laser melting of the copper produces a soft copper sphere 9 at the tip end of the beam lead 13, but leaves the rest of the beam of copper hard except for a short distance (100-400 micrometers) next to the ball. We have discovered by experimentation the unexpected phenomenon that the heating of the beam lead does not damage the polyimide support structure. The arc process described below can be substituted for the laser process.

A reducing-gas jet 63 of a miture of hydrogen in argon gas is applied to the beams 13 to assure that the copper beams and soft copper balls 9 are not oxidized by the laser heating and formation of the balls 9.

A positioning X-Y-Z table 64 is used to position the beams under the focussed laser beam 59. The completed balltape 70 passes through bath 71 to plate or coat the copper, and then the completed product is collected by the take-up reel 72.

The plating bath may contain plating solutions appropriate for electroless plating onto the balltape balls of a thin layer of Au, or Sn, or Cu, or Ni or Pd or other metals appropriate for bonding. Or the baths may contain solutions for electroplating Au, Sn, Ni, Pd or other metals onto Cu tape. Such metals are adapted to bonding by soldering, thermocompression bonding, ultrasonic bonding, welding, or other bonding techniques. Platable solders include PbSn and dipped solders such as PdSn, In containing solders such as PbIn.

We have formed the balls 9 on planar TAB tape 10 by using an electric arc or plasma energy delivered from a tungsten tip maintained at a high electrical voltage relative to the TAB beam to melt back the beam end of a TAB structure. The beams should be charged positively with respect to the negatively charged electrode. We used an atmosphere of 10 percent hydrogen in nitrogen gas. High voltage pulses (3 kV) were delivered to the beam end which was placed 40 mils from a tungsten probe. The pulses originated from an IBM PC, with suitable software for the purpose, which allowed us (within limits) to vary both the number of pulses as well as the pulse width. The pulses were fed to a linear preamplifier, which enabled us to control the final peak voltage of the pulse. The signals were then fed to a linear power amplifier, which drove the input of a step-up transformer whose output was tied to the tungsten probe. Five pulses with a pulse width of 1 millisecond and a duty cycle of 50% were used to form the structure at the end of a rectangular copper beam 4 mils by 1.4 mils. The quick process referred to hereinafter as the arcball process produced an annealed ball at the end of the hard copper beam without damage to the polyimide support structure, located 30 mils from the center of the ball.

A key element in the usefulness of this technique is the formation of a ball whose position and diameter are reproducibly controlled. By controlling the power delivery, and relying on the heat generation and dissipation processes to be dependent solely on the voltage pulse or pulses applied, the ball may be reproducibly formed and positioned.

However, this may place restrictions on the tolerances allowable on material thickness and width. One modification of the planar tape structure which may ease the material tolerances and may broaden the acceptable electrical process window is shown in FIG. 11. In this case the melt-back of a beam is limited by a geometrical cross section change which imposes a discontinuity in heat conduction and temperature in the beam, thereby establishing an accurately defined ball position. The structure shown in FIG. 11 illustrates a beam lead 13 before the ball 9 has been formed thereon. The beam lead 13 requires no additional processing steps beyond those currently required for planar tape. In particular, the beam leads 13 are narrower at neck 73 near the tip end before the ball 9 is formed. As the ball 9 is formed by the focussed-energy-beam from the electrode 77, the heat dissipation rate will increase as the narrow portion 78 of the conductive metallic beam 13 is liquefied by the heat from the focussed-energy-beam and the ball 9 reaches the wider portion 79 of the conductive metallic beam 13. This will tend suddenly to lower the temperature of the ball 9 and thereby limit the continued melting of the beam once the ball 9 reaches the wider beam portion 78.

FIG. 12 shows an alternative design for the beam of FIG. 11 with a notch 73' introduced in the beam 13 forming a narrow waist which limits the melting of the beam when heated by an energy beam to the mass desired to the distal portion 250 of the beam 13.

Another approach in controlling the ball size and position is to control the electrical parameters with respect to voltage and pulse width. A high voltage pulse of extremely short duration produces such results. Such a circuit consists of a standard high speed step up transformer, suitable drive and control electronics, as well as a crowbar circuit whose activation is critically timed. The crowbar circuit precludes the requirements for providing control of such pulses in the drive circuit or transformer, as it shunts the output of the transformer at a selected time. This provides very well controlled duration of the high voltage pulses.

In FIG. 13, an array of conductive beams 9 may be an arc melted by a plurality of isolated electrodes 75 of the appropriate geometry. An insulating body 76 holds the electrode 75 to ensure that all thebeams to be arc-formed experience the same density of electric field, and that individual arcs are struck to each lead in FIG. 13. Each electrode is connected by a line 77 to a power supply.

Additional means by which uniformity of the melt back can be obtained are to switch rapidly between each electrode, or each beam on the tape itself. This may be done in adjacent frames in a simultaneous manner, so that although only one beam is being modified per frame at a given time, multiple frames may be made at once.

The arcball-process permits the manufacture of balltape, which may be extended to area bumped tape. Thus, it is possible to package chips of various designs and types with minimal or no modification of the I/O pads. Any of the standard bonding techniques may be employed.

In FIG. 13, for example, the electric arc may be directed to the terminal end 78 of the metallic conductor 13 in the presence of a magnetic field whose field lines B connect the end of the metallic conductor 13 with the source 75 of the electric arc.

B. MULTILAYER PACKAGING

Figure 14:
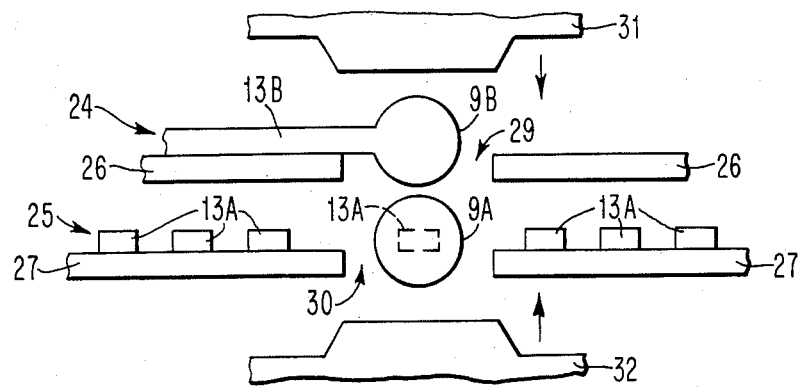
FIG. 14 shows a multilayer electronic chip package with at least two layers of balltape including beam leads terminating in balls extending through holes in the polymeric film sheets. The balls are aligned and adapted for thermocompression bonding of the balls together on both in the layers of metallization on respective polymeric film sheets.

FIG. 14 shows a multilayer electronic chip package with at least two layers of balltape with layers of metallization 24, 25 on respective polymeric film sheets 26 and 27. In order to make a multilayer structure in accordance with this aspect of this invention, two polyimide films 26 and 27 with appropriate copper lines 24 and 25 are laid down by normal lithographic techniques, with holes 29 and 30 opened up in the polyimide at the positions of the ends of the copper lines 24 and 25 which are to be connected together. The ends of the copper lines are melted by a laser beam, and the copper balls 9A and 9B are produced in the desired locations, accurately. The sheets 26 and 27 of polyimide in FIG. 14 are laid next to each other in the correct registration, and a heated thermocompression bonder with pads 31 and 32 is used top and bottom to press the balls 9A, 9B together to make a joint as shown in FIG. 14. The diameter of the coupler balls is great enough so that they touch and deform without bending the copper leads 13A, 13B to which they are attached. The process is described in greater detail below.

Figure 15:
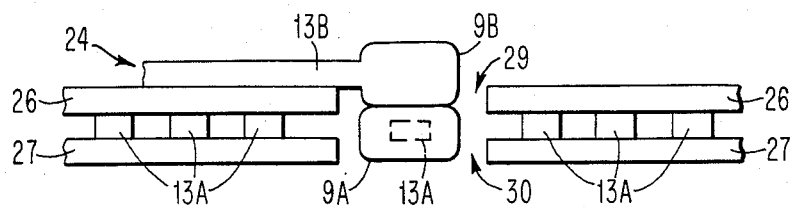
FIG. 15 shows the package of FIG. 14 with the two balls shown in FIG. 14 bonded together to interconnect two beam leads on the two stacked balltape layers.

In general, in FIGS. 14 and 15, layers of metallization 24 and 25 are separated by the layer 26 of insulative material (preferably a polymeric film such as a sheet of polyimide.) The upper layer of metallization 24 is supported by the sheet 26 of polyimide film. The upper layer of metallization 24 includes beam leads 13B directed across the page from left to right ending in ball-tape ball 9B. The lower layer of metallization 25 includes beam leads 9A directed at right angles to the beam leads 13B shown as metallization 24, and metallization layer 25 is supported by insulative material 27. One of the beam leads 13B in layer 24 is shown terminating in a ball 9B which overlies a ball 9A which is at the tip end of a beam lead 13A which is a part of the metallization layer 25. The ball 9B which is on the tip end of one of the beams leads 13B in metallization layer 24, overlies a ball 9A.

In the process of manufacture of the devices of FIG. 14, before the balls 9A and 9B are formed, holes such as 29 and 30 are opened in layers 26 and 27 respectively, using techniques such as punching, chemical etching, or laser ablative processing. Balls 9B and 9A are then formed by means of laser, arc or alternative focussed energy heating of the tip ends of the beam leads in the open holes.

After the the balls 9A and 9B have been formed in the respective layers, the sheets of polyimide 26 and 27 are laid next to each other in the desired orientation using registration markings. More specifically, the film of polyimide 26 with its ball 9B and the film 27 with its ball 9A are stacked with substrate 26 on top of ball 9A and layer 27, etc. The balls 9A and 9B are juxtaposed and aligned approximately along their diameters as shown in FIG. 14.

A pair of heated thermocompression bonder pads 31 and 32 are used (on the outer surfaces of the two stacked sheets) to press the balls 9A and 9B together to make the joint between those two balls. The diameters of the copper balls 9A, 9B is great enough so that they touch and deform without bending the copper beam leads 13A and 13B to which they are joined as shown in FIG. 15.

Figure 16:
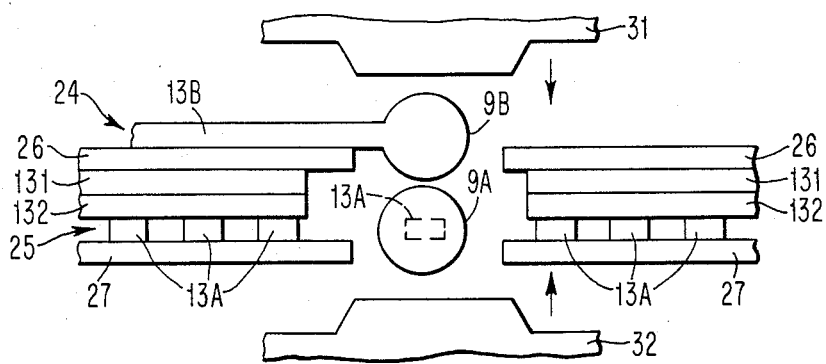
FIG. 16 depicts an arrangement in which two signal planes and a ground plane are bonded in a multilayer structure.

FIG. 16 depicts an arrangement in which two signal planes and a ground plane are bonded in a multilayer structure. Between polyimide layer 26 and conductor layer 25 of FIGS. 14 and 15 are inserted a conductive ground plane layer 131 supported by a polyimide layer 132. Layer 132 rests on beam lead conductor layer 25. Polymeric, insulating layer 27 is located directly beneath beam-lead, conductive layer 25.

Figure 17:
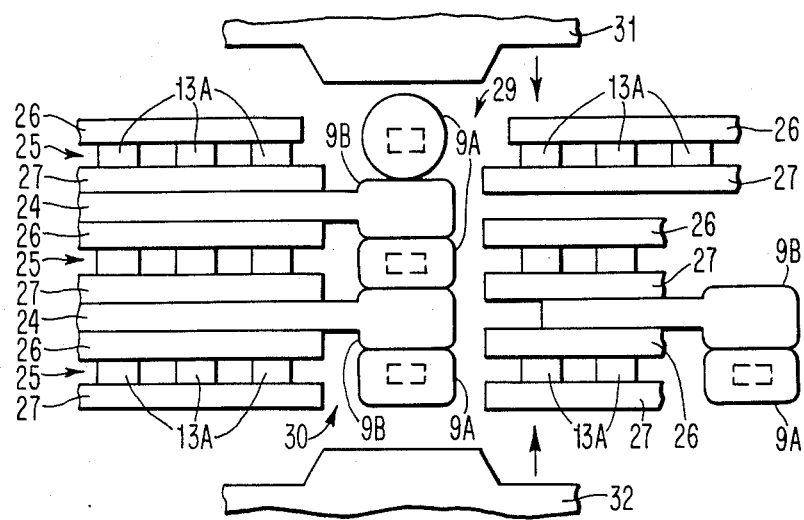
FIG. 17 shows a via connection in a multilayered package by fabricated using TAB balltape bonding, with one ball remaining to be bonded to the top of the balltape via. The via shown is fabricated in a multilayered structure including many laminated layers of the kind shown in FIGS. 14 and 15.

FIG. 17 shows in the context of the balltape technology, how to produce a via connection for an multilayered package by means of repeated TAB balltape bonding steps. The via shown in FIG. 17 is fabricated in a multilayered structure including many laminated layers of the kind shown in FIGS. 14 and 15. The top level is a ball 9A and wiring layer 25 which have been covered by an extra sheet 26 which is an additional extra layer providing electrical insulation. The bottom four balls 9A, 9B, 9A, and 9B have been bonded previously before layers 25 and 27were added to the layer including ball 9B. Layer 26 can be added after the ball 9A on top has been bonded to the other four balls by the pressure and heat of compression bonder pads 31 and 32.

Figure 18:
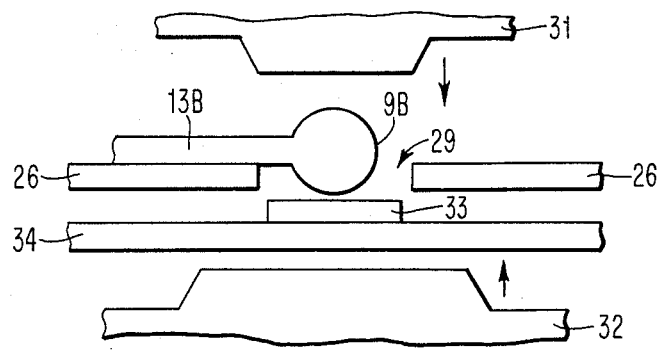
FIG. 18 shows a balltape ball on a polymeric thin film subtrate prepared for bonding of the ball to a copper pad supported by a polymeric insulative sheet.

FIG. 18 shows bonding of a ball on a balltape sheet to a copper pad on a polymeric substrate composed of a material such as polyimide. A single ball 9B supported by a beam on a polyimide layer 26 is ready to be bonded to a copper pad 33 on a layer 34 of insulating support such as polyimide (polymeric insulative sheet.)

UNIVERSAL CHIP INTERCONNECTION PACKAGE

Figure 19:
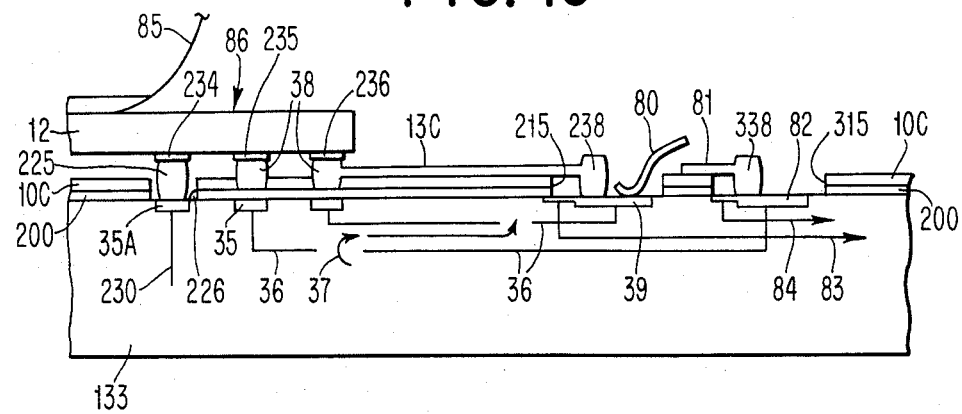
FIG. 19 shows a Multi-Layered Ceramic (MLC) substrate which has been modified to incorporate a section of ball tape on the upper surface of the MLC substrate to permit modification or repair of the MLC substrate.

FIG. 19 shows a Multi-Layered Ceramic (MLC) substrate 133 which has been modified to incorporate a section of a TAB balltape laminate 10C on the upper surface of the MLC substrate 133. This is useful in cases in which the MLC substrate 133 is being 1) repaired to overcome otherwise irreparable defects, 2) modified to provide different functions or 3) modified to be capable of accepting different kinds of chips such as chip 12 bonded to the MLC by solder balls referred to as C-4's (Controlled Collapse Chip Connections), i.e. flip chips solder balls or wire bond design chips, i.e. with bare metal I/O pads.

FIG. 19 shows that a non C-4 chip may be bonded MLC substrate 133 carrying C-4 solder ball connections using a section of the balltape 10C. Alternatively, FIG. 19 shows how a C-4 chip can be used with a defective MLC substrate 133. Conductive thin film pads 39 and 82 on the surface of the MLC package 133 are connected to redistribution wiring lines 36 with defects 37 in the lines, comprising open circuits. Defects 37 in wiring 36 in substrate 133 must be repaired. Thus lines 36 must be replaced by engineering change connections by means of engineering change lead wires (such as wire 80.) Balltape ball 238 on the end of lead 13C which is supported by tape 10C is shown connected to the pad 39 on the MLC substrate 133. through a window 215 in tape 10C. The other end of lead 13C is connected to pad 236 on chip 12. Pad 39 which is on the surface of the MLC is connected to the EC lead wire 80. EC lead wire 80 is required in the circuit to make an engineering change connection to another point on the surface of substrate 133, as is well known by those skilled in the art. To prevent short circuits or connections no longer desired from being completed accidentally, an insulator sheet 200 is interposed on the surface of the MLC 133 and its pads, between the balls 38 and the layer of pads 35, 39 and 82. This provides electrical insulation between the pads 35 on the MLC substrate 133 and the balltape balls 38 (immediately above pads 35) which are connected to the pads 235 and 236 on the chip 12, which pads 235 and 236 previously were to be connected to the pads 35 by C-4 connections before the balltape 10C was inserted between the chip 12 and the MLC substrate 133 to make a repair or an engineering change. As stated above, balltape ball 238 is connected through the window 215 in balltape 10C between a beam lead 13C and EC pad 39 which is connected to redistribution wiring 36 buried in the MLC substrate 133. Lead wire 83 is provided for connection to other devices or other parts of the circuit. Another balltape ball 338 is connected through a window 315 in balltape 10C between a beam lead 81 and EC pad 82. Pads 39 and 82 respectively are connected to lines 83 and 84 which comprise personalized wiring buried in the MLC substrate 133 as will be understood by those skilled in the art. A C-4 solder ball 225 provides a bond between pad 234 on chip 12 and pad 35A on MLC 133. Solder ball 225 extends through a hole 226 punched in the insulator layer 200 and tape 10C, as shown. The solder ball bond 225 is made by normal solder reflow techniques. Pad 35A is connected to line 230 in MLC substrate 133. A thermal cooling piston 85 is shown resting on the back 86 of the chip 12.

The balltape type of interconnection tape 1C described herein makes possible the joining of chips 12 to various types to MLC substrates 133, with irreparable defects such as open circuits 37 in the interconnection wiring in the package. The spherical contacts 9 of the balltape 10C allow the use of various different types of chips with minor changes or no changes in the bare pad metallurgy, as well as providing a soft bonding contact to both the chip 12 and the MLC substrate 1-33, to eliminate damage to the bonding surfaces.

The package consists of the chip 12 to be joined and a polyimide and copper laminate 10C (inexpensive TAB balltape) which serves to connect the chip I/O pads to the MLC substrate EC pads as shown in FIG. 19. The tip ends of the conductive (copper) beam leads are formed into spherical bonding contacts, i.e. balltape balls 38, 238 and 338.

A chip 12 is first bonded to the balltape interconnection package 10C using the appropriate bonding method. Chip 12 is bonded to the balltape 10C by means of a thermode with thermocompression bonding pads as in FIGS. 14, 16, 18, etc., as is well known to those skilled in the art. Chips 12 with bare metal pads can be bonded using standard thermocompression bonding or ultrasonic bonding methods, as is well known to those skilled in the art.

Then the chip 12 and the package 133 to which it is bonded are excised from the balltape strip of the kind shown in FIGS. 1 and 10, and then the Outer Lead Bonds (OLB) are registered with respect to the MLC substrate EC pads. The bonds are made between the copper balls and the molybdenum-nickel-gold EC pads using standard thermocompression, ultrasonic, laser, or other bonding techniques. The chip 12 can be placed either face-up or face-down on the MLC substrate. A thin layer of insulation such as polyimide 200 is placed under the chip 12 for the purpose of avoiding electrical short circuits between the chip and the conductors on the substrate.

Figure 20:
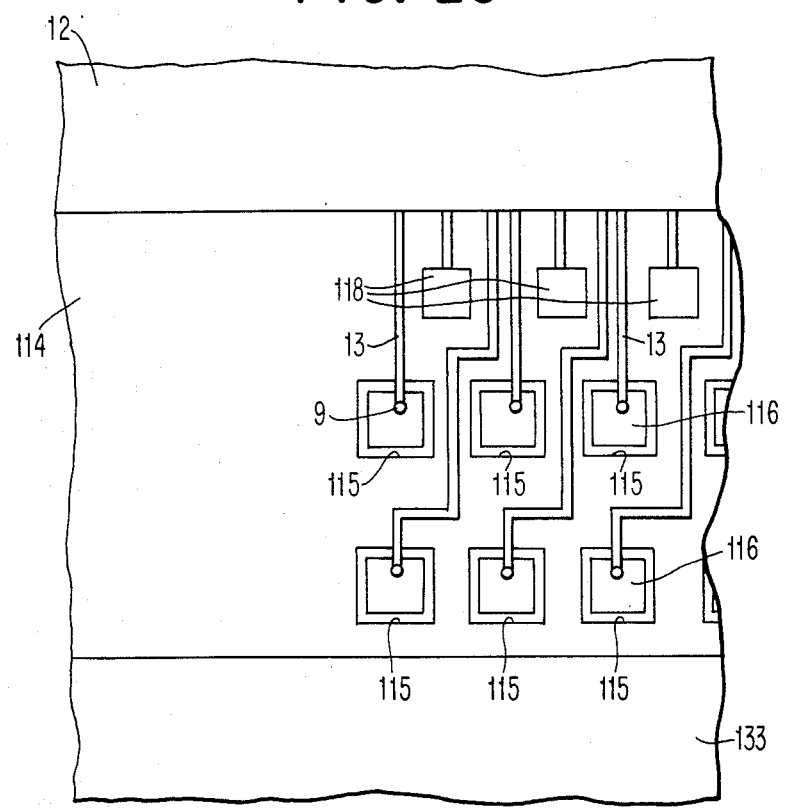
FIG. 20 shows an arrangement for providing additional Engineering Change (EC) pads for a packing laminate.

FIG. 20 shows a plan view of a chip interconnection arrangement similar to that of FIG. 19 for providing additional Engineering Change (EC) pads for a TAB balltape packaging laminate 114. This allows the use of existing wirebonding machinery to provide additional EC capability with additional EC pads 118 as shown by FIG. 20.

For the case in which a high I/O (Input/Output) count chip is used and the number of I/O pads needed exceeds the number of immediately available substrate EC pads 116 on the MLC substrate 133 (which are seen through windows 115 in TAB laminate 114), lines connected to the chip I/O pads may terminate in addlitional EC pads 118 on top of the laminate 114. These lines may then be connected to other points on the substrate, using wirebonding machinery.

Industrial Applicability

This invention is applicable in data processing such as personal computers, minicomputers, large scale computers and other data processing equipment. In addition, this system and process will be applicable to industrial and consumer electronic devices employing LSI chips. Electronic products such as transportation and control systems incorporating data processing systems for continuous monitoring and like functions can use the packaging methods and systems of this invention.

What is claimed is:

1. A multilayer packaging structure for electronic devices having a via structure for interconnection of electrical conductors on different levels in said package comprising:
   a first substrate having a first beam lead, a substrate on a film of a flexible insulative material, a first opening through said insulative film of said first substrate, said first substrate supporting said first beam lead so that a portion of said first beam lead extends in cantilevered fashion into said first opening, said first beam lead terminating in a first ball extending above and below said first substrate through said first opening, said first ball being integrally formed with said first beam lead,
   a second substrate of an insulative material stacked with respect to said first substrate,
   said second substrate having a second beam lead on a film of flexible insulative material, said second substrate including a second opening aligned with said first opening in said first substrate, said second beam lead terminating in a second ball extend above and below said second substrate and extending in cantilevered fashion into said second opening, said second ball being integrally formed with said second beam lead,
   said second ball being juxtaposed with and bonded to said first ball, whereby a via is formed electrically connecting said first and said second beam leads.

2. A multilayer packaging structure for electronic devices comprising a via structure for interconnection of electrical conductors on different levels in a package comprising:
   a first substrate having a beam lead on a flexible film of an insulative material, an opening through said first substrate,
   said first substrate supporting said beam lead so that a portion of said beam lead extends in cantilevered fashion into said opening, said beam lead terminating in a ball extending above and below said substrate through said
   opening, said ball being integrally formed with said beam lead,
   a second substrate composed of an insulative material stacked with respect to said first substrate, said second substrate including a pad thereon aligned with said opening in said first substrate,
   said ball being juxtaposed with and bonded to said pad, whereby a via is provided between said beam lead on said first substrate and said pad on said second substrate.

3. A structure in accordance with claim 1 including a ground plane between said first and said second substrates.

4. An electronic package for an electronic chip comprising:
   a flexible dielectric substrate carrying at least one metallic tape beam lead and at least one bridging-beam lead, said bridging-beam lead having balls at each end thereof integrally formed with said bridging-beam lead, said metallic tape beam lead having an inner end terminating in a ball integrally formed with said beam lead and an outer end extending across an outer edge of said substrate,
   a plurality of openings in said substrate,
   said substrate supporting said metallic tape beam lead so that said ball at said inner end thereof extends in cantilevered fashion into one of said plurality of openings, and
   said metallic tape beam lead extending across said outer edge (89) of said substrate (107),
   each of said balls at the ends of said bridging-beam lead extending in cantilevered fashion into one of said plurality of openings.

5. An electronic package in accordance with claim 4, further including an electronic chip including pads thereon, said balls at said ends of said bridging-beam lead and said ball at said inner end of said metallic tape beam lead being aligned with and bonded to at least a portion of said pads on said chip.

6. An electronic assembly comprising:
   a chip having contact pads thereon,
   a packaging substrate including pads thereon and circuit lines therein,
   a chip overlay substrate for electrically interconnecting said packaging substrate to said chip,
   said overlay substrate comprising a layer of flexible insulative material,
   said overlay substrate carrying at least one metallic tape beam lead having an inner and outer end,
   said overlay substrate having at least one opening therein aligned with a pad on said packaging substrate,
   said overlay substrate supporting said at least one metallic tape beam lead so that an inner end of said beam lead extends in cantilevered fashion into said opening, said inner end and said outer end of said beam lead terminating in balls extending above and below said overlay substrate said balls being integrally formed with said beam lead,
   at least one of said balls being bonded to at least one of said pads on said packaging substrate, and
   at least one of said balls being bonded to at least one of said pads on said chip.

7. An electronic assembly in accordance with claim 6, further including a bridging-beam lead on said overlay substrate having at each end thereof balls integrally formed with said bridging-beam lead, said bridging-beam lead providing electrical connections between at least a pair of pads on said chip.

8. An electronic assembly in accordance with claim 6, including a solder ball providing a connection between a pad on said chip and a pad on said packaging substrate through an opening in said overlay substrate.

9. An electronic assembly in accordance with claim 6, including a beam lead connected by a plurality of balls integrally formed with said beam lead to a plurality of said pads on said chip.

10. A tape for use in tape automated bonding of electrically conductive, metallic tape beam leads to pads on integrated circuits, said tape having a substrate of a carrier film of a polymeric material formed with a plurality of frames defined by openings therethrough, comprising:
    said carrier supporting a plurality of said beam leads at each of said frames so that a portion of each of said plurality of beam leads extends across a portion of said opening,
    said beam leads terminating in conductive balls extending in cantilevered fashion into said openings and extending above and below said polymeric material, said balls being integrally formed with said beam leads, and
    said balls being coated with a bondable film of a metal selected from the group consisting of Au, Pd, Sn, Ni, Pb containing solders and In containing solders.

11. A process of fabricating tape automated bonding materials, providing polymeric tape having first and second surfaces carrying leads in the form of metallic conductor beams on one of said surfaces,
   said metallic conductor beams including terminal ends, and
   directing an electric arc at a said terminal end of a said metallic conductor beam to form a ball at said terminal end.

12. A process of fabricating tape automated bonding materials, providing polymeric tape having first and second surfaces carrying leads in the form of metallic conductor beams on at least one of said surfaces, said metallic conductor beams including terminal ends, and said beam having a smaller cross sectional area proximate said terminal end prior to heating of said metallic conductor beam, directing a source of focussed energy beam at a said terminal end of a said metallic conductor beam to form a ball at said terminal end.

13. The process of claim 12 wherein said source of focussed energy is applied by the step of directing said energy at a said terminal end of said metallic conductor beam in the presence of a reducing gas atmosphere to form a ball at a said terminal end of a said metallic conductor.

14. The process of claim 12 wherein
said focussed energy comprises a laser beam.

15. The process of claim 12 wherein said focussed energy is applied by an electric arc by the step of establishing an electric arc with said terminal end of said metallic conductor.

16. The process of claim 15 wherein said energy is applied in the presence of an inert or a reducing gas atmosphere to form said ball at a said terminal end of said metallic conductor.

17. The process of claim 15 wherein said electric arc is directed at the terminal end of said metallic conductor in the presence of a magnetic field whose field lines connect the end of said metallic conductor with the source of said electric arc.

18. A structure comprising:
   at least two substrates each having an aperture therein;
   each of said substrates having at least one conductor on the surface of a flexible dielectric layer, said conductor projecting in cantilevered fashion into said aperture and terminating in a truncated sphere-like protuberance in said aperture, said protuberance extending above and below the said layer; and
   the first of said at least two substrates being disposed over the second of said at least two substrates, one of said dielectric layers being between said conductors on each of said layers, said sphere-like protuberances being aligned and the truncated parts of said protuberances being electrically bonded together forming an electrical connection between said conductors on each of said substrates.

19. A structure for electrically connecting a beam lead on a first side of a flexible dielectric layer to a beam lead on a second side of a dielectric layer comprising:
   an aperture in said flexible dielectric layer; and
   said beam leads on said first side and said second side projecting in cantilevered fashion into said aperture and terminating in a truncated sphere-like protuberance, the truncated parts of said protuberances being bonded together to form an electrical connection between said beam leads on said first and said second first sides of said flexible dielectric layer.

20. A structure comprising:
   a substrate with a contact pad thereon;
   a flexible dielectric layer having a first and second side with an aperture therein;
   a beam lead on the first side of said layer, said beam lead projecting in cantilevered fashion into said aperture and terminating in a truncated sphere-like protuberance within said aperture, said truncated portion of said protuberance extending to at least said second side of said flexible dielectric layer;
   said dielectric layer being disposed over said substrate, said protuberance being aligned with said pad, said truncated portion of said protuberance being electrically bonded to said pad.

21. The structure of claim 19, wherein a conductor is embedded within said dielectric layer and is electrically isolated from said first and said second conductors.

22. A structure comprising:
   a flexible dielectric layer having a first and second side;
   a plurality of apertures in said dielectric layer;
   a bridging beam lead on said first side, each end of said bridging beam lead projecting in cantilevered fashion into one of said apertures, each end of said bridging beam lead terminating in a truncated sphere-like protuberance which is integrally formed with said bridging beam lead;
   at least one beam lead on said first side having an inner and outer end, said outer end projecting in cantilevered fashion over the outer edge of said dielectric layer, said inner end projecting in cantilevered fashion into one of said apertures, said inner end terminating in a truncated sphere-like protuberance, which is integrally formed with said beam lead;
   an electronic device having contact pads thereon;
   said second side of said layer being placed facing said electronic device, said sphere-like protuberances being aligned with corresponding contact pads on said electronic device; and
   the truncated part of said protuberances extending through said apertures to said second side and being electrically bonded to said contact pads.

23. An electronic assembly comprising:
   an electronic device having contact pads thereon;
   a substrate having contact pads thereon;
   an overlay substrate having conductors thereon for electrically connecting at least one of said substrate contact pads to at least one of said electronic device contact pads;
   said overlay substrate being formed from flexible insulative material;
   said overlay substrate having at least one aperture therein;
   at least one of said conductors being a beam lead having a first and second end, said first end projects in cantilevered fashion into said at least one aperture terminating in a truncated sphere-like protuberance which is integrally formed with said beam lead, the truncated part of said protuberance at said first end being electrically bonded to one of said contact pads on said substrate; and
   said second end of said beam lead terminating in a truncated sphere-like protuberance which is integrally formed with said beam lead, the truncated part of said protuberance at said second end being electrically bonded to said contact pad on said electronic device.

24. The electronic assembly of claim 23 further including on said overlay substrate a bridging beam lead having at each end thereof a truncated sphere-like protuberance integrally formed with said bridging beam lead, the truncated portion of each said protuberances at said ends of said bridging beam lead being electrically bonded to contact pads on said electronic device.

25. The electronic assembly of claim 23 further including at least one solder ball disposed between at least one of said contact pads on said electronic device and at least one of said contact pads on said substrate forming a solder bond there between through an aperture in said overlay substrate.

* * * * *